United States Patent
Musashi

(10) Patent No.: US 10,831,099 B2
(45) Date of Patent: Nov. 10, 2020

(54) METHOD FOR MANUFACTURING OPTICAL MEMBER

(71) Applicant: NICHIA CORPORATION, Anan (JP)

(72) Inventor: Naoki Musashi, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/744,659

(22) Filed: Jan. 16, 2020

(65) Prior Publication Data

US 2020/0241412 A1    Jul. 30, 2020

(30) Foreign Application Priority Data

Jan. 24, 2019    (JP) .................................. 2019-010119

(51) Int. Cl.
| | |
|---|---|
| G03F 7/00 | (2006.01) |
| C03C 15/00 | (2006.01) |
| G03F 7/32 | (2006.01) |
| G03F 7/36 | (2006.01) |
| H01L 33/58 | (2010.01) |

(52) U.S. Cl.
CPC ............ *G03F 7/0005* (2013.01); *C03C 15/00* (2013.01); *G03F 7/32* (2013.01); *G03F 7/36* (2013.01); *H01L 33/58* (2013.01); *H01L 2933/0058* (2013.01)

(58) Field of Classification Search
None
See application file for complete search history.

(56) References Cited

U.S. PATENT DOCUMENTS

| | | | | |
|---|---|---|---|---|
| 4,631,351 A | * | 12/1986 | Tawada ................. | H01L 31/046 136/244 |
| 4,670,097 A | * | 6/1987 | Abdalla .......... | H01L 31/022475 216/13 |
| 5,688,415 A | * | 11/1997 | Bollinger ................. | G03F 1/20 216/60 |
| 2015/0017389 A1 | * | 1/2015 | Chai ........................ | G03F 7/16 428/156 |
| 2016/0087158 A1 | * | 3/2016 | Lim ........................ | H01L 33/38 438/29 |

FOREIGN PATENT DOCUMENTS

| | | |
|---|---|---|
| JP | H11-174215 A | 7/1999 |
| JP | 2000-094451 A | 4/2000 |
| JP | 2002-350623 A | 12/2002 |
| JP | 2005-140893 A | 6/2005 |
| JP | 2007-001829 A | 1/2007 |

* cited by examiner

*Primary Examiner* — Shamim Ahmed
(74) *Attorney, Agent, or Firm* — Foley & Lardner LLP

(57) ABSTRACT

A method for manufacturing an optical member includes: forming a mask pattern on a glass member, the mask pattern comprising oxygen and indium; performing dry etching on the glass member using the mask pattern as a mask, while using an etching gas comprising fluorine; after performing the dry etching, performing wet etching on the glass member using the mask pattern as a mask, while using an etching solution comprising fluorine; and after alternately repeating performing the dry etching and the wet etching a plurality of times, removing the mask pattern.

18 Claims, 4 Drawing Sheets

METHOD FOR MANUFACTURING OPTICAL MEMBER

CROSS-REFERENCE TO RELATED APPLICATION

This application is based upon and claims priority to Japanese Patent Application No. 2019-010119, filed on Jan. 24, 2019, the entire contents of which are incorporated herein by reference.

FIELD

Embodiments described herein relate generally to a method for manufacturing an optical member.

BACKGROUND

In order to control the light distribution characteristics of the light emitting element, Japanese Patent Publication No. 2007-001829 proposes to provide an optical member made of a transparent material on the light extraction surface of the light emitting element. As a method for manufacturing such an optical member, a method of processing a glass member is conceivable, however it is difficult to form a structure having a high aspect ratio with high shape accuracy.

SUMMARY

According to one embodiment of the present invention, a method for manufacturing an optical member is disclosed. The method can include forming a mask pattern including oxygen and indium on a glass member, and performing dry etching on the glass member using the mask pattern as a mask, the dry etching using an etching gas including fluorine. The method can include, after performing the dry etching, performing wet etching on the glass member using the mask pattern as a mask, the wet etching using an etching solution including fluorine. The method can include, after alternately repeating performing the dry etching and the wet etching a plurality of times, removing the mask pattern.

According to one embodiment, another method for manufacturing an optical member is disclosed. The method can include forming a mask pattern including oxygen and indium on a glass member, and performing dry etching on the glass member using the mask pattern as a mask, the dry etching using an etching gas including fluorine. The method can include, after performing the dry etching, performing wet etching on the glass member using the mask pattern as a mask, the wet etching using an etching solution including fluorine. The method can include, after performing the wet etching, further performing the dry etching on the glass member using an etching gas including fluorine. In addition, the method can include removing the mask pattern.

DETAILED DESCRIPTION

Hereinafter, a method for manufacturing an optical member according to the embodiment is described.

Figure 1A:
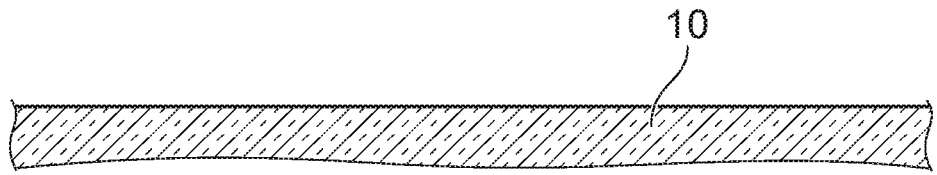
FIG. 1A to FIG. 1C are end views showing a method for manufacturing an optical member according to one embodiment of the invention.
Figure 1B:
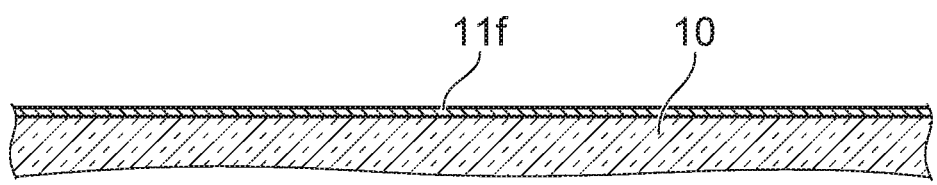
Figure 1C:
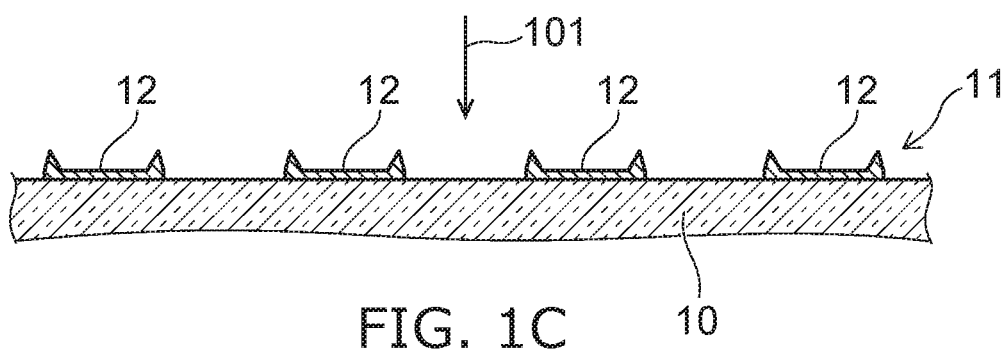

FIG. 1A to FIG. 1C are end views showing a method for manufacturing an optical member according to the embodiment.

Figure 2A:
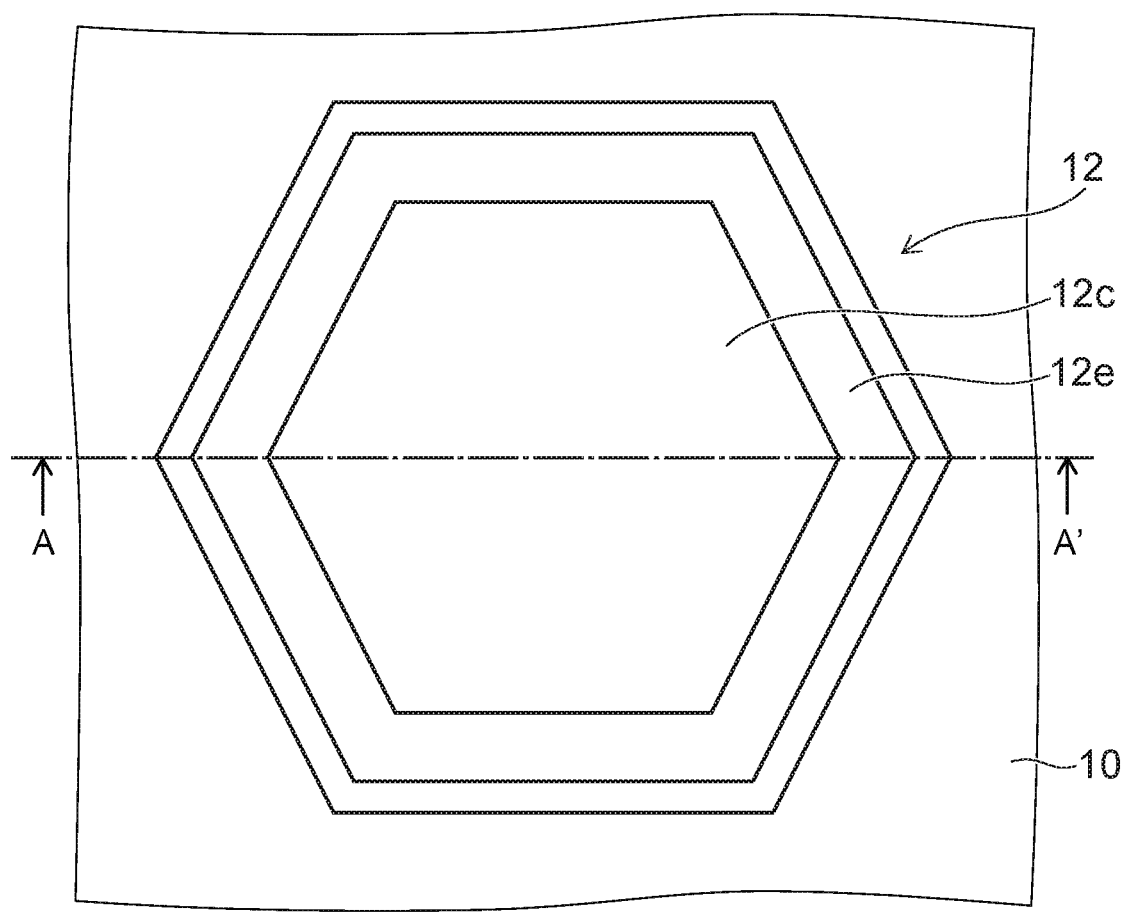
FIG. 2A is a top view showing one pattern element of a mask pattern formed in the embodiment.
Figure 2B:
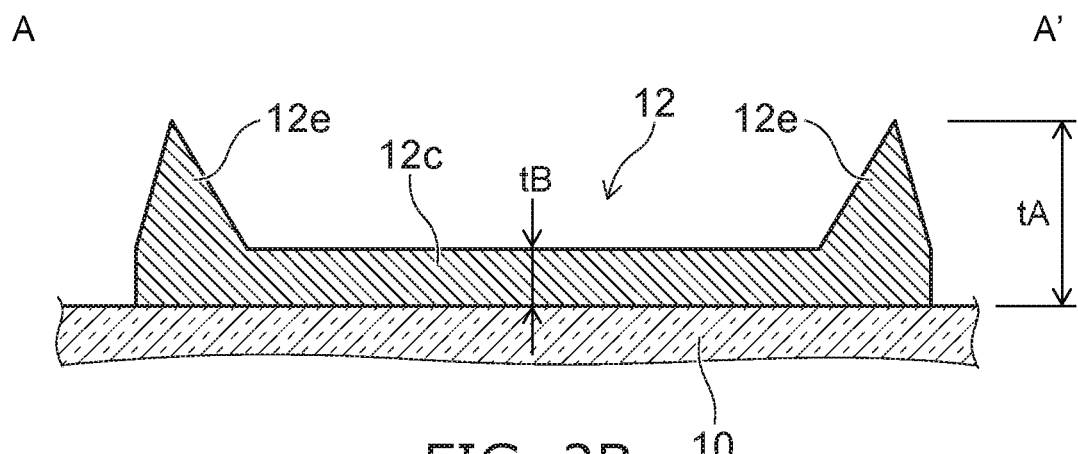
FIG. 2B is an end view taken along line A-A' shown in FIG. 2A.

FIG. 2A is a top view showing one pattern element of the mask pattern formed in the embodiment. FIG. 2B is an end view taken along line A-A' shown in FIG. 2A.

FIG. 3A to FIG. 3D are end views showing a method for manufacturing the optical member according to the embodiment.

Figure 4A:
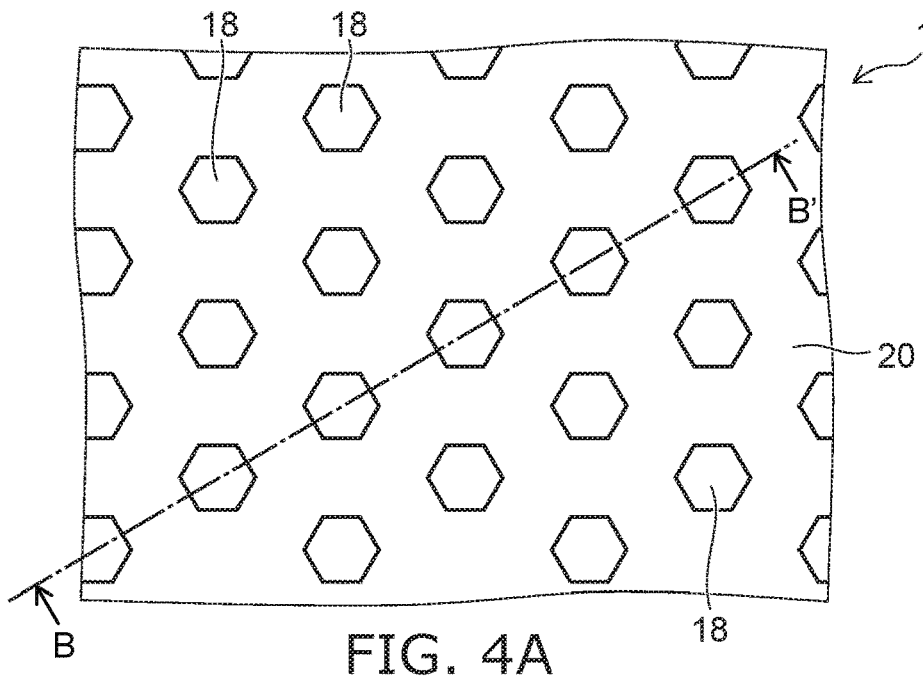
FIG. 4A is a top view showing the optical member manufactured by the embodiment.
Figure 4B:
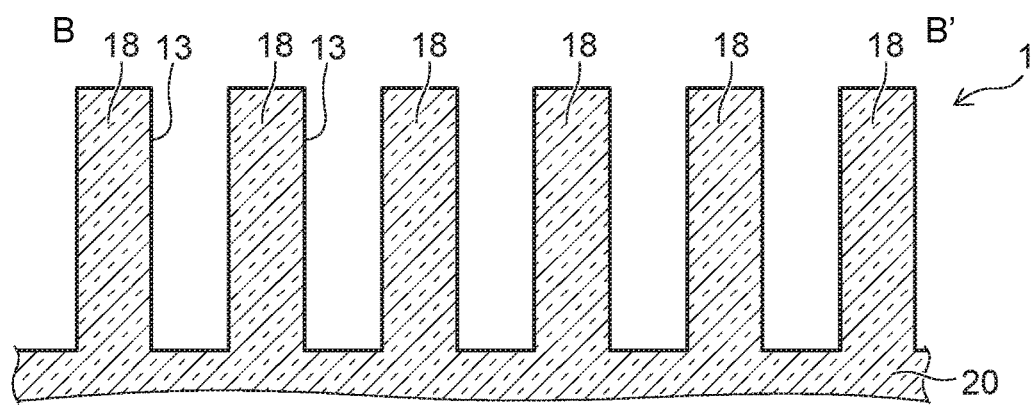
FIG. 4B is an end view showing the optical member manufactured by the embodiment.
Figure 4C:
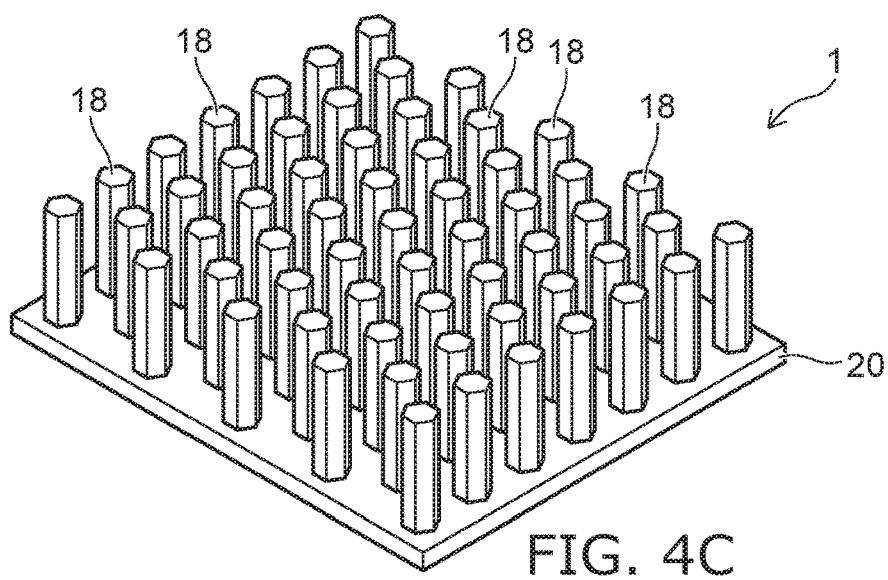
FIG. 4C is a perspective view showing the optical member manufactured by the embodiment.

FIG. 4A is a top view showing the optical member manufactured by the embodiment. FIG. 4B is an end view taken along line B-B' in FIG. 4A. FIG. 4C is a perspective view of the optical member according to the embodiment.

<Mask Pattern Forming Process>

First, as shown in FIG. 1A, a glass member 10 is prepared. The glass member 10 is, for example, a plate-like member having translucency and includes, for example, borosilicate glass.

Next, as shown in FIG. 1B, a mask film 11f is formed on the glass member 10. The mask film 11f includes oxygen (O) and indium (In), for example, indium tin oxide (ITO) or indium zinc oxide (IZO). For example, the mask film 11f is formed as a continuous film on the entire surface of the glass member 10. The film thickness of the mask film 11f is, for example, not less than 100 nm and not more than 300 nm.

Next, the mask film 11f shown in FIG. 1B is irradiated with laser light 101 as shown in FIG. 1C. Thereby, a portion of the mask film 11f irradiated with the laser light 101 is vaporized, and the mask film 11f is selectively removed. As a result, as shown in FIG. 1C, a mask pattern 11 is formed from the remaining portion of the mask film 11f. The mask pattern 11 includes multiple pattern elements 12. The pattern elements 12 are arranged in a matrix, for example. The pattern elements 12 may be arranged irregularly. When viewed from above, the pattern elements 12 may have a circular shape, a polygonal shape or other shapes. Also, the shapes of the multiple pattern elements 12 may be the same or somewhat different from each other. In the embodiment, an example will be described, in which the shapes of the multiple pattern elements 12 forming the mask pattern 11 are the same and the shape of the pattern elements 12 in a top view is a regular hexagon.

As shown in FIG. 2A and FIG. 2B, in each pattern element 12, a peripheral edge portion 12e is raised, and the peripheral edge portion 12e is thicker than a central portion 12c. For example, the maximum thickness tA of the peripheral edge portion 12e of the pattern element 12 is not less than two times the minimum thickness tB of the central portion 12c. That is, $tA \geq 2 \times tB$. The value of the ratio of the thickness tA to the thickness tB (tA/tB) is preferably not less than 2 and not more than 100. The maximum diameter of the pattern element 12 in a top view is preferably, for example, not less than 1 μm and not more than 50 μm, for example, 9 μm. When the pattern elements 12 are periodically arranged, the interval between the pattern elements 12 is preferably not less than 14 μm and not more than 16 μm.

<First Dry Etching Process>

Figure 3A:
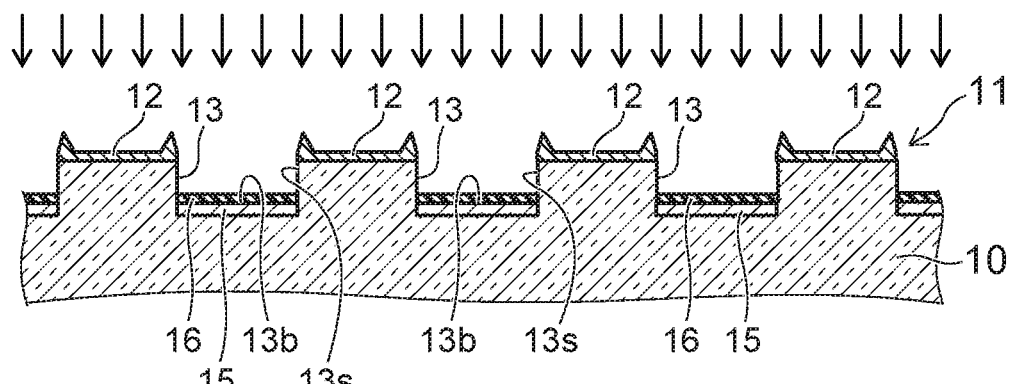
FIG. 3A to FIG. 3D are end views showing the method for manufacturing the optical member according to the embodiment.

Next, as shown in FIG. 3A, dry etching is performed on the glass member 10 using the mask pattern 11 as a mask. In this dry etching, an etching gas including fluorine is used. As dry etching, for example, RIE (Reactive Ion Etching) is performed. For example, trifluoromethane ($CHF_3$) is used as an etching gas for dry etching. Thereby, a recess 13 is formed in a region that is not covered with the pattern elements 12 in the glass member 10, and the portion covered with the pattern elements 12 protrudes relatively. In the embodiment, a portion of the glass member 10 that is covered with the pattern elements 12 and surrounded by the recess 13 protrudes relatively in a top view.

At this time, a damaged layer 15 with damage introduced by the dry etching is formed on a bottom surface 13b of the recess 13. Residues resulting from the dry etching are deposited on the bottom surface 13b of the recess 13, and a residue layer 16 is formed. In other words, the residue layer 16 is formed on the damaged layer 15. The residues are, for example, impurities or the like included in the glass member 10 and difficult to be removed by the dry etching.

<First Wet Etching Process>

Figure 3B:
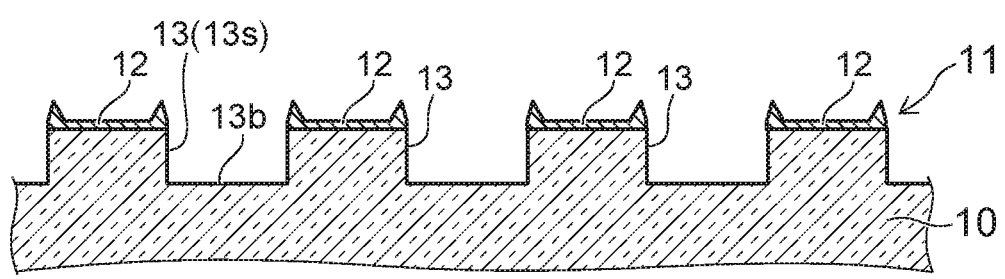

Next, as shown in FIG. 3B, after the dry etching process shown in FIG. 3A, wet etching is performed on the glass member 10 using the mask pattern 11 as a mask. In the wet etching, an etching solution including fluorine, for example, buffered hydrofluoric acid (BHF), is used. Thereby, the residue layer 16 is removed. The time period for performing the wet etching is shorter than the time period for performing the dry etching.

At this time, the bottom surface 13b and a side surface 13s of the recess 13 in the glass member 10 are also etched. However, because the damaged layer 15 having a higher etching rate than the glass member 10 during the wet etching is formed on the bottom surface 13b of the recess 13, the bottom surface 13b is etched more than the side surface 13s. Thereby, at least a part of the damaged layer 15 is removed. FIG. 3B shows an example in which the entire damaged layer 15 is removed. However, only a part of the damaged layer 15 may remain so as not to affect the etching of the glass member 10 in a later process.

<Second Dry Etching Process>

Figure 3C:
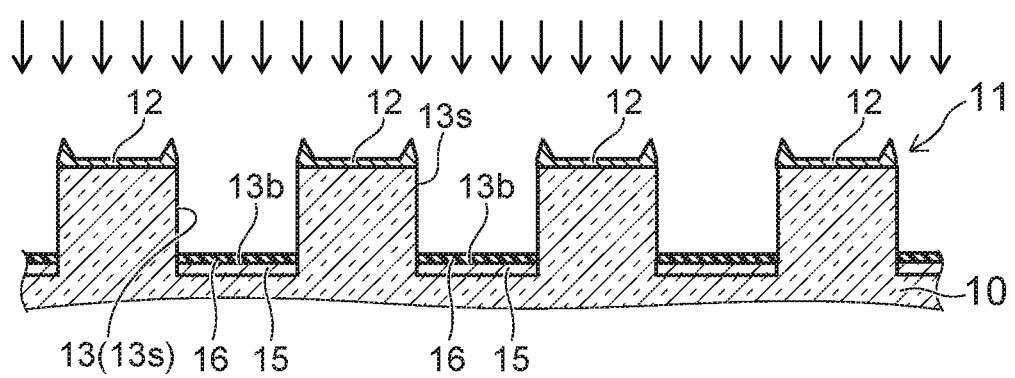

Next, as shown in FIG. 3C, after the wet etching process shown in FIG. 3B, the glass member 10 is subjected to dry etching again. Also in this dry etching, the mask pattern 11 is used as a mask, and etching is performed using an etching gas including fluorine. For example, the conditions for the second dry etching shown in FIG. 3C are the same as the conditions for the first dry etching shown in FIG. 3A. Thereby, the bottom surface 13b of the recess 13 is further etched and the recess 13 is further deepened. Similar to the first dry etching, the damaged layer 15 is formed on the bottom surface 13b of the recess 13 in the glass member 10, and the residue layer 16 is deposited on the bottom surface 13b. The amount of etching of the glass member 10 can be easily controlled by making the conditions for the second dry etching the same as the conditions for the first dry etching.

<Second Wet Etching Process>

Figure 3D:
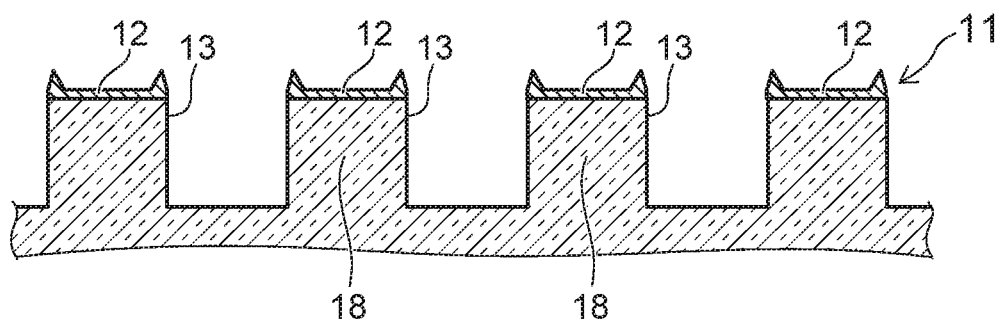

Next, as shown in FIG. 3D, after the dry etching process shown in FIG. 3C, the glass member 10 is subjected to the wet etched again. Also in this wet etching, the mask pattern 11 is used as a mask and an etching solution including fluorine is used. For example, the conditions for the second wet etching shown in FIG. 3D are the same as the conditions for the first wet etching shown in FIG. 3B. Thereby, the residue layer 16 formed by the second dry etching is removed. Further, at least the part of the damaged layer 15 formed by the second dry etching is also removed.

Thereafter, the above-described dry etching process and wet etching process are alternately repeated a plurality of times. The time period for performing each dry etching is longer than the time period for performing each wet etching. In one example, each dry etching is performed for 1 hour, and each wet etching is performed for 2 minutes. The number of repetitions of the dry etching processes and the wet etching processes is, for example, six. Thereby, for example, the glass member 10 is etched by 10 µm or more in the thickness direction from the upper surface of the glass member 10. A portion surrounded by the recess 13 in the glass member 10 is a columnar portion 18. In the embodiment, because the top view shape of the pattern element 12 is a regular hexagon, the top view shape of the columnar portion 18 is also a regular hexagon.

<Mask Pattern Removing Process>

Next, the mask pattern 11 shown in FIG. 3D is removed. For example, wet etching using aqua regia is performed to dissolve the mask pattern 11. Thus, the optical member 1 according to the embodiment is manufactured.

<Configuration of Optical Member>

Hereinafter, the configuration of the optical member 1 manufactured by the manufacturing method of the embodiment is described.

In the optical member 1, as shown in FIG. 4A to FIG. 4C, a plate-like base material portion 20 is provided, and multiple columnar portions 18 are provided on the base material portion 20. The shape of the columnar portion 18 is columnar. The columnar portion 18 is a portion covered with the pattern element 12 in the glass member 10. A recess 13 is formed between the columnar portions 18. In the example shown in FIG. 4A, the shape of the columnar portion 18 is a regular hexagonal column. As shown in FIG. 4C, the columnar portions 18 are arranged at the same period along three directions forming an angle of 120 degrees with each other when viewed from above.

The maximum diameter of the columnar portion 18 in a top view is, for example, not less than 1 µm and not more than 50 µm, for example, 7 µm. For example, the columnar portions 18 are periodically arranged, and the interval between the columnar portions 18 is, for example, not less than 14 µm and not more than 16 µm. The interval between the columnar portions 18 is the shortest distance between adjacent columnar portions 18 in a top view. Moreover, the height of the columnar portion 18 is, for example, not less than 10 µm and not more than 30 µm. Here, the height of the columnar portion 18 is a distance from the upper surface of the base material portion 20 to the upper surface of the columnar portion 18. The ratio of the height of the columnar portion 18 to the maximum diameter of the columnar portion 18 in a top view, that is, the aspect ratio is not less than 10 and not more than 30. Note that the shape of the columnar portion 18 does not have to be strictly a columnar shape. For example, the upper diameter may be smaller than the lower diameter.

By arranging such an optical member 1 on a light extraction surface of a light emitting element, for example, an LED (Light Emitting Diode), each columnar portion 18 guides light emitted from the light emitting element, and front luminance can be improved.

Next, the effect of the embodiment will be described.

In the embodiment, the glass member 10 includes borosilicate glass. For this reason, the etching of the glass member 10 is easy, and the productivity of the optical member 1 is high. Further, a structure having a high aspect ratio can be manufactured by processing the glass member 10 by dry etching.

In the embodiment, by alternately performing dry etching and wet etching, the residue layer 16 generated in the dry etching process can be removed in the wet etching process. As a result, efficient processing becomes possible in the next dry etching process.

If the wet etching is not performed after the dry etching process, the residue layer 16 inhibits the dry etching, so that the efficiency of the dry etching is lowered, and finally the dry etching may be impossible. In particular, when the glass member 10 includes borosilicate glass, the residue layer 16 is likely to be generated as compared with quartz glass or the like with few impurities.

On the other hand, in the manufacturing method of the embodiment, the wet etching process is provided between the dry etching processes, thereby the residual layer 16 can be removed and the etching can proceed efficiently. For this reason, the productivity of the optical member 1 is improved, and the columnar portion 18 having a high aspect ratio can be formed. Moreover, because the time period during which the glass member 10 is exposed to the dry etching is shortened by improvement of the efficiency of the dry etching, the shape accuracy of the columnar portion 18 is improved. Thus, according to the manufacturing method of the embodiment, the method for manufacturing the optical member that can form a structure with a high aspect ratio and high shape accuracy can be realized.

Further, in the manufacturing method of the embodiment, the time period for performing dry etching is longer than the time period for performing wet etching. Thereby, the time period required for the etching process can be shortened while suppressing the side surface 13s of the recess 13 from being etched by wet etching.

Furthermore, in the embodiment, in the pattern element 12 of the mask pattern 11, the peripheral edge portion 12e that tends to be etched faster than the central portion 12c is made thicker than the central portion 12c. For example, it is preferable that the maximum thickness to of the peripheral edge portion 12e is twice or more the minimum thickness tB of the central portion 12c. Thereby, it can suppress that the peripheral edge portion 12e of the pattern element 12 disappears ahead of the central portion 12c with progress of etching, and can suppress the shoulder drop of the columnar portion 18. As a result, the columnar portion 18 having a high aspect ratio can be formed with high shape accuracy.

Further, a film including oxygen and indium, for example, a film made of indium tin oxide, is formed as the mask film 11f, and the mask pattern 11 is formed by laser processing, thereby the pattern element 12 having the peripheral edge portion 12e thicker than the central portion 12c can be formed. The reason is presumed to be that a part of the mask film 11f vaporized by the laser light irradiation is reattached to the peripheral edge portion 12e of the pattern element 12.

Further, when the mask pattern 11 includes oxygen and indium, high selectivity can be obtained in the etching of the glass member 10. This also improves the shape accuracy of the columnar portion 18.

In addition, in the embodiment, although an example in which the glass member 10 includes borosilicate glass has been described, the material of the glass member 10 is not limited to this. The glass member 10 may be formed of, for example, quartz that does not substantially include impurities. However, when the glass member 10 includes impurities such as boron oxide, aluminum oxide, or sodium oxide, the residue layer 16 due to those impurities is likely to be generated, and thus the effect of the embodiment is enhanced.

In the embodiment, an example in which the dry etching process and the wet etching process are performed six times has been described, but the number of repetitions of the dry etching process and the wet etching process may be any number. The dry etching process may be performed at least twice, and the wet etching process may be performed at least once.

Embodiments of the invention can be used for, for example, in a light-emitting device or the like.

What is claimed is:

1. A method for manufacturing an optical member, the method comprising:
    forming a mask pattern on a glass member, the mask pattern comprising oxygen and indium;
    performing dry etching on the glass member using the mask pattern as a mask, while using an etching gas comprising fluorine;
    after performing the dry etching, performing wet etching on the glass member using the mask pattern as a mask, while using an etching solution comprising fluorine; and
    after alternately repeating performing the dry etching and the wet etching a plurality of times, removing the mask pattern.

2. The method according to claim 1, wherein:
    the mask pattern comprises a plurality of pattern elements, and
    a thickness of a peripheral edge portion of at least one of the pattern elements is higher than a thickness of a central portion of the at least one of the pattern elements.

3. The method according to claim 2, wherein:
    a maximum thickness of the peripheral edge portion is twice or more a minimum thickness of the central portion.

4. The method according to claim 1, wherein:
    said forming the mask pattern comprises:
        forming a mask film on the glass member, and
        irradiating the mask film with laser light so as to selectively remove portions of the mask film and thereby form the mask pattern.

5. The method according to claim 1, wherein:
    a time period during which the dry etching is performed is longer than a time period during which the wet etching is performed.

6. The method according to claim 1, wherein:
    the mask pattern comprises indium oxide or indium zinc oxide.

7. The method according to claim 1, wherein:
    the glass member comprises borosilicate glass.

8. The method according to claim 1, wherein:
    the glass member is etched by 10 µm or more from an upper surface of the glass member in a thickness direction by alternately repeating performing the dry etching and performing the wet etching a plurality of times.

9. The method according to claim 1, wherein:
    a thickness of the mask pattern is not less than 100 nm are not more than 300 nm.

10. A method for manufacturing an optical member, the method comprising:
    forming a mask pattern on a glass member, the mask pattern comprising oxygen and indium;

performing dry etching on the glass member using the mask pattern as a mask, while using an etching gas comprising fluorine;

after performing the dry etching, performing wet etching on the glass member using the mask pattern as a mask, while using an etching solution comprising fluorine;

after performing the wet etching, again performing the dry etching on the glass member using the mask pattern as a mask, while using an etching gas comprising fluorine; and removing the mask pattern.

11. The method according to claim 10, wherein:
the mask pattern comprises a plurality of pattern elements, and
a thickness of a peripheral edge portion of at least one of the pattern elements is greater than a thickness of a central portion of the at least one of the pattern elements.

12. The method according to claim 11, wherein:
a maximum thickness of the peripheral edge portion is twice or more a minimum thickness of the central portion.

13. The method according to claim 10, wherein:
said forming the mask pattern comprises:
forming a mask film on the glass member, and
irradiating the mask film with laser light so as to selectively remove portions of the mask film and thereby form the mask pattern.

14. The method according to claim 10, wherein:
a time during which the dry etching is performed is longer than a time during which the wet etching is performed.

15. The method according to claim 10, wherein:
the mask pattern comprises indium oxide or indium zinc oxide.

16. The method according to claim 10, wherein:
the glass member comprises borosilicate glass.

17. The method according to claim 10, wherein:
the glass member is etched by 10 μm or more from an upper surface of the glass member in a thickness direction by alternately repeating performing the dry etching and performing the wet etching a plurality of times.

18. The method according to claim 10, wherein:
a thickness of the mask pattern is not less than 100 nm are not more than 300 nm.

* * * * *

UNITED STATES PATENT AND TRADEMARK OFFICE
CERTIFICATE OF CORRECTION

PATENT NO. : 10,831,099 B2  
APPLICATION NO. : 16/744659  
DATED : November 10, 2020  
INVENTOR(S) : Naoki Musashi Page 1 of 1

It is certified that error appears in the above-identified patent and that said Letters Patent is hereby corrected as shown below:

In the Claims

Claim 9, Column 6, Lines 62-63:
Please delete:
"a thickness of the mask pattern is not less than 100 nm are not more than 300 nm."
Please replace with:
"a thickness of the mask pattern is not less than 100 nm and not more than 300 nm."

Claim 18, Column 8, Lines 21-22:
Please delete:
"a thickness of the mask pattern is not less than 100 nm are not more than 300 nm."
Please replace with:
"a thickness of the mask pattern is not less than 100 nm and not more than 300 nm."

Signed and Sealed this  
Twenty-sixth Day of January, 2021

Drew Hirshfeld  
*Performing the Functions and Duties of the*  
*Under Secretary of Commerce for Intellectual Property and*  
*Director of the United States Patent and Trademark Office*